United States Patent [19]
Kobayashi et al.

[11] Patent Number: 5,583,455
[45] Date of Patent: Dec. 10, 1996

[54] SEMICONDUCTOR LOGIC CIRCUIT USING A FIRST POWER SOURCE AND A SECOND POWER SOURCE

[75] Inventors: Tomohiro Kobayashi, Kawasaki; Hatsuhiro Kato, Hakodate, both of Japan

[73] Assignee: Kabushiki Kaisha Toshiba, Kawasaki, Japan

[21] Appl. No.: 357,517

[22] Filed: Dec. 16, 1994

[30] Foreign Application Priority Data

Dec. 21, 1993 [JP] Japan .................................. 5-322859

[51] Int. Cl.⁶ .............................................. H03K 19/0175
[52] U.S. Cl. .............................................. 326/110; 326/84
[58] Field of Search .......................... 326/84, 109, 110

[56] References Cited

U.S. PATENT DOCUMENTS

| | | | |
|---|---|---|---|
| 4,701,635 | 10/1987 | Kawazoe et al. | 326/109 X |
| 4,730,132 | 3/1988 | Watanabe et al. | 326/110 |
| 4,897,564 | 1/1990 | Chen | 326/110 |
| 4,906,868 | 3/1990 | Maki et al. | 326/110 |
| 4,950,925 | 8/1990 | Doi et al. | 326/110 X |

*Primary Examiner*—David R. Hudspeth
*Attorney, Agent, or Firm*—Foley & Lardner

[57] ABSTRACT

A BiNMOS inverter and a BiCMOS inverter are utilized. The BiNMOS inverter uses first and second power sources. A potential of the second power source is greater than that of the first power source. The BiNMOS has a first bipolar transistor whose collector being connected to the first power source and whose emitter being connected to an output node, and a first P-type field effect transistor group having at least one P-type field effect transistor through which a drain-source current channel consists of the base of the first bipolar transistor and the second power source based on an input signal transmitted to at lease one input node.

8 Claims, 11 Drawing Sheets

SEMICONDUCTOR LOGIC CIRCUIT USING A FIRST POWER SOURCE AND A SECOND POWER SOURCE

BACKGROUND OF THE INVENTION

1. Field of the Invention

The present invention relates to a semiconductor logic circuit such as a Bipolar CMOS (BiCMOS) gate and the like used under a low power source voltage.

2. Description of the Prior Art

Conventionally, a BiCMOS type logical gate in which a bipolar transistor and a MOS transistor are formed on a same semiconductor substrate is used in an element which requires high velocity as a logical gate and whereby a large drive ability can be obtained.

Figure 1:
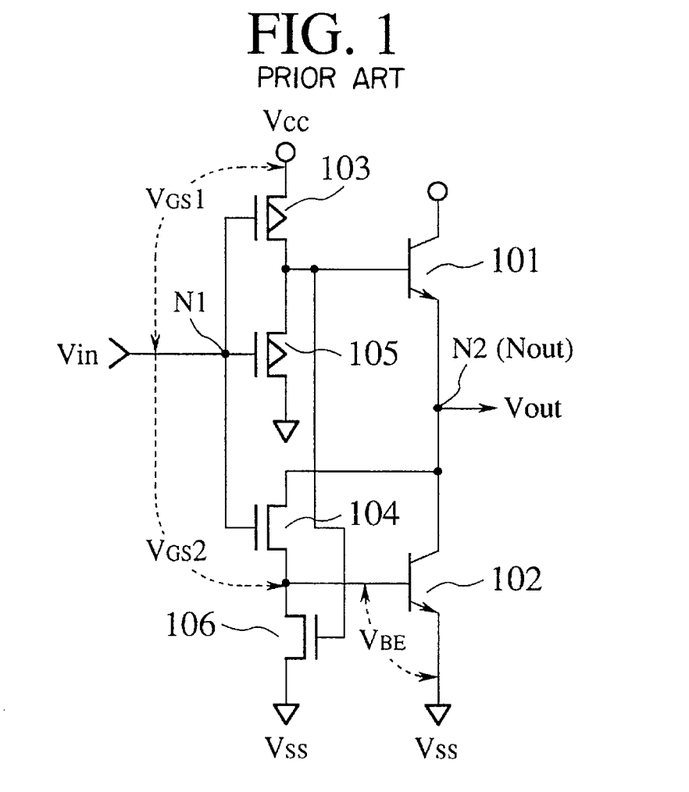
FIG. 1 is a circuit diagram for a conventional BiCMOS inverter.

FIG. 1 is a circuit diagram for a conventional BiCMOS inverter.

As shown in the drawing, in this BiCMOS inverter, output of a pull-up section and a pull-down section for driving a load consist of a bipolar (NPN) transistors 101, 102 respectively. Currents of bases of the bipolar transistors 101, 102 are driven or controlled by the drain current of a P channel type MOS transistor (hereinafter P-MOS) 103 and an N channel type MOS transistor (hereinafter N-MOS) 104. Also, when an input signal VIN is switched from the H to the L level and from a Low level( L level) to a High level(H level), the base current is pulled out by an N-MOS Transistor 105 and an N-MOS 106 respectively.

In using this BiCMOS inverter, when the input signal VIN transmitted to an input node N1 is at the L level, the P-MOS Tr 103 is ON and the base of the bipolar transistor 101 is charged to a power source voltage VCC. As a result, the bipolar transistor 101 is turned ON and an output node N2 is charged. At this time the N-MOS 104 is OFF, therefore the bipolar transistor 102 is also OFF. Accordingly, the output Vout of the output node N2 is pulled H level.

In addition, when the input signal VIN is at the H level, the N-MOS 104 is ON and the base of the bipolar transistor 102 is charged. As a result, the bipolar transistor 102 is turned ON and the output node N2 is discharged. At this time the P-MOS 103 is OFF, therefore the bipolar transistor 101 is also OFF. Accordingly, the output Vout of the output node N2 is pulled L level.

Figure 2:
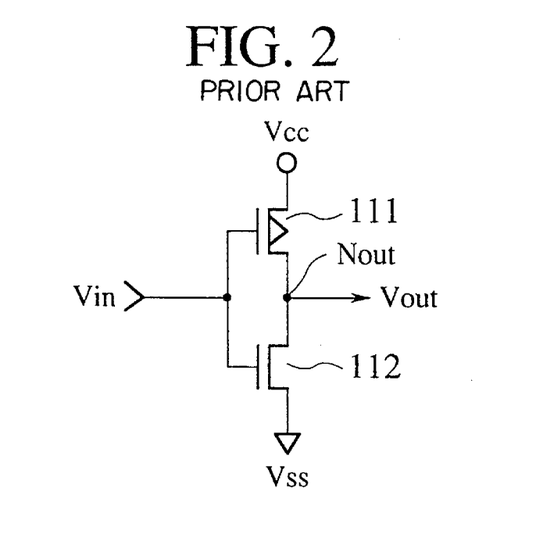
FIG. 2 is a circuit diagram for a conventional CMOS inverter.

As described above, the BiCMOS gate has a high speed characteristics superior to a CMOS gate comprising a PMOS transistor 111 and a NMOS transistor 112 which are connected complementarily shown in FIG. 2, because bipolar transistors with a large drive ability are used for driving the in the pull-up operation and the pull-down operation at the Vout in the semiconductor logic circuit.

However, as the miniaturization of MOS transistors has proceeded in recent years, there has been a tendency to reduce the power source voltage VCC. For example, during the operation of the BiCMOS inverter shown in FIG. 1, a voltage potential VGS1 between the gate and the source of the P-MOS 103 used for pull-up operation to drive loads through the node N2 becomes VGS1=VIN–VCC. Also, a voltage potential VGS2 between the gate and the source of the N-MOS 104 for driving the bipolar transistor 102 used for pull-down operation to drive the loads through the node N2 becomes VGS2=VIN–VSS–VBE (where VBE is the voltage between the base and emitter of the bipolar transistor 102).

In the case where an operation is considered at a low power source voltage VCC of 3.3 Volts as compared to an operation at a comparatively high power source voltage VCC of 5 Volts, the ratio of the base-emitter voltage VBE (about 0.8 Volts) of the transistor 102 to the gate source voltage VGS of the MOS transistor 104 becomes large.

As a result, there is the problem that the drain current of the N-MOS transistor 104 for driving the bipolar transistor 102 used for the pull-down operation becomes extremely small, the drive ability for the pull-down operation suddenly drops, and delay time of this gate is caused in the above-mentioned BiCMOS gate shown in FIG. 1.

Figure 3:
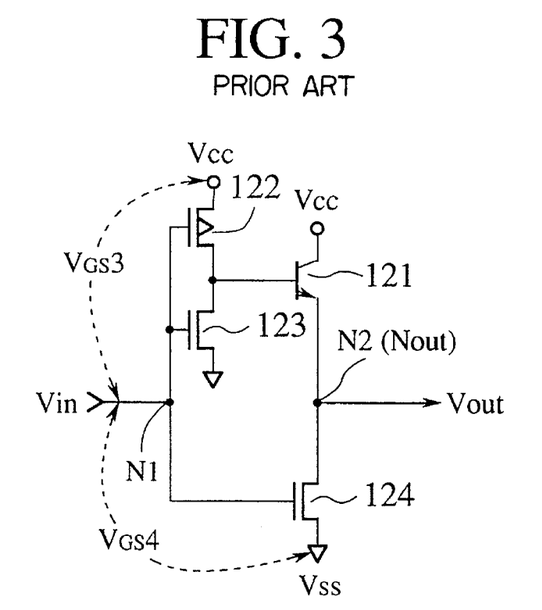
FIG. 3 is a circuit diagram for a conventional BiNMOS inverter.

Accordingly, to eliminate this type of problem described above, a BiNMOS gate consists of a bipolar transistor and a N-MOS transistor as an output section, as shown in FIG. 3, is commonly known. FIG. 3 shows one example of this BiNMOS inverter including the BiNMOS gate.

As illustrated in the drawing, a section for the pull-up operation of this BiNMOS inverter has a bipolar transistor 121 in the same manner as in the BiCMOS inverter shown in FIG. 1. The base of the bipolar transistor 121 is driven by the drain current of a P-MOS 122 transistor. When the input signal VIN is switched from the H to L level, the base current is pulled out by an N-MOS transistor 123. In addition, a section for the pull-down operation of the BiNMOS inverter consists of an N-MOS transistor 124 whose gate is directly connected to the input node N1 only. Specifically, because in this BiNMOS gate the drive ability of the pull-down output of the BiNMOS gate is reduced along with the reduction of the power source voltage VCC as outlined above, the section of the pull-down operation in the BiNMOS inverter is formed from the N-MOS transistor 124 only in order to solve this problem.

During the operation of this BiNMOS inverter shown in FIG. 3, a voltage potential VGS3 between the gate and the source of the P-MOS transistor 122 becomes VGS3=VIN–VCC, and a voltage potential VGS4 between the gate and the source of the N-MOS transistor 124 on the section side of the pull-down operation becomes VGS4=VIN–VSS. As a result, as in the above-mentioned BiCMOS gate shown in FIG. 1, the magnitude of the drive ability of the BiNMOS inverter shown in FIG. 3 is not affected by the relative magnitude of the source voltage VCC and the base-emitter voltage VBE.

Accordingly, by means of the BiNMOS gate shown in FIG. 3, the reduction in the gate delay which accompanies the reduction in the source voltage VCC can be reduced further than for the BiCMOS gate shown in FIG. 1.

However, in the circuit configurations of FIG. 1 and FIG. 3 outlined above, the output Vout is not charged (discharged) up to the source potential (or the ground potential). Specifically, there is the problem that a full swing operation is not carried out.

To explain in more detail, when the input signal VIN is at the L level in the BiCMOS gate shown in FIG. 1, the base of the bipolar transistor 101 is charged to the source voltage VCC, and the output Vout is only charged to Vout=VCC–VBE. Also, when the input signal VIN is at the H level, the output Vout from the bipolar transistor 102 is discharged to the same potential as the base of the bipolar transistor 102 and is not discharged to the ground level.

On the other hand, in the BiNMOS gate shown in FIG. 3, the pull-down operation in the BiNMOS inverter undergoes a full swing, and the pull-up operation is only charged to Vout=VCC–VBE in the same manner as for the BiCMOS gate shown in FIG. 1.

Figure 4:
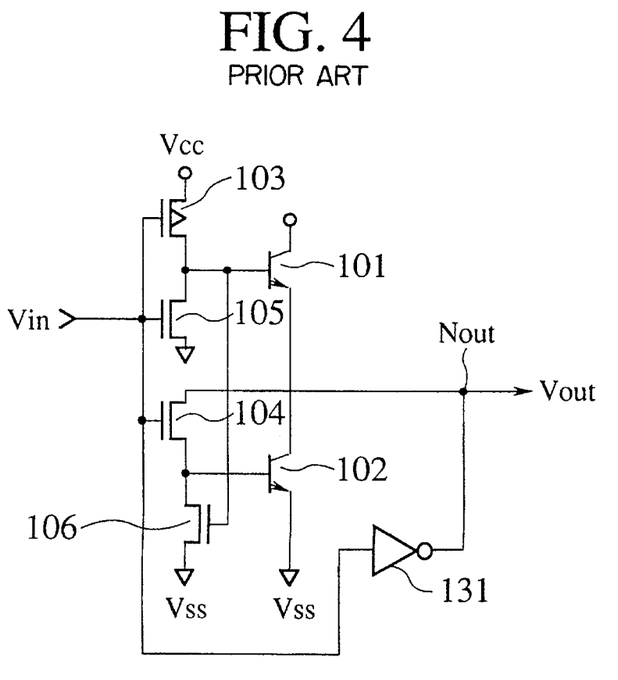
FIG. 4 is a circuit diagram showing another conventional BiNMOS gate or inverter.
Figure 5:
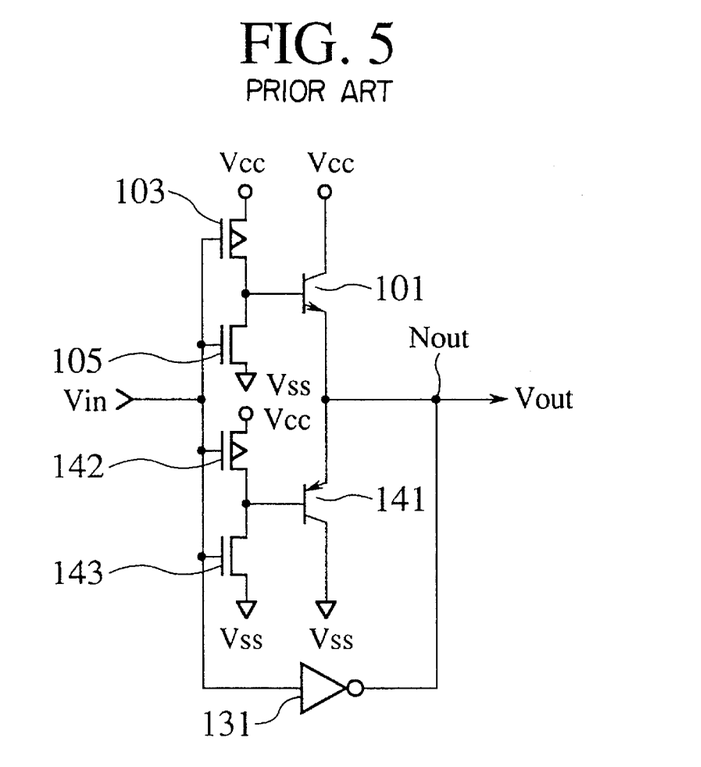
FIG. 5 is a circuit diagram showing another conventional BiNMOS gate or inverter.
Figure 8:
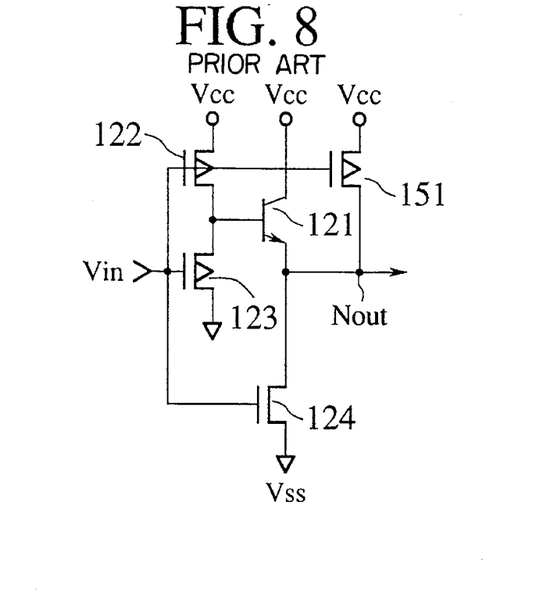
FIG. 8 is a circuit diagram showing another conventional BiNMOS gate.

Improved models of the above-mentioned BiCMOS gate (FIG. 1) and BiNMOS gate (FIG. 3) for which a full swing operation is not performed are shown in FIG. 4, FIG. 5, and FIG. 8.

FIG. 4 is a circuit diagram showing another conventional BiNMOS gate. Like reference numerals designate parts identical to or corresponding to those illustrated in FIG. 1.

This BiCMOS gate shown in FIG. 4 is a modification the BiCMOS gate shown in FIG. 1 in order to perform a full swing operation.

Specifically, a COS inverter 131 is connected in parallel to the BiCMOS gate shown in FIG. 1. Due to the operation of the inverter 131, pull-up operation performs a full swing to the source voltage VCC, and the pull-down operation to the ground potential.

A BiCMOS gate of this configuration has been proposed which is a modification of the BiCMOS gate shown in FIG. 5. Specifically, a PNP transistor 141 has been substituted for the pull-down operation of the NPN bipolar transistor. A P-MOS transistor 142 and an N-MOS transistor 143 connected in the same manner to the pull-up operation are connected to the base of the PNP transistor 141.

Figure 6:
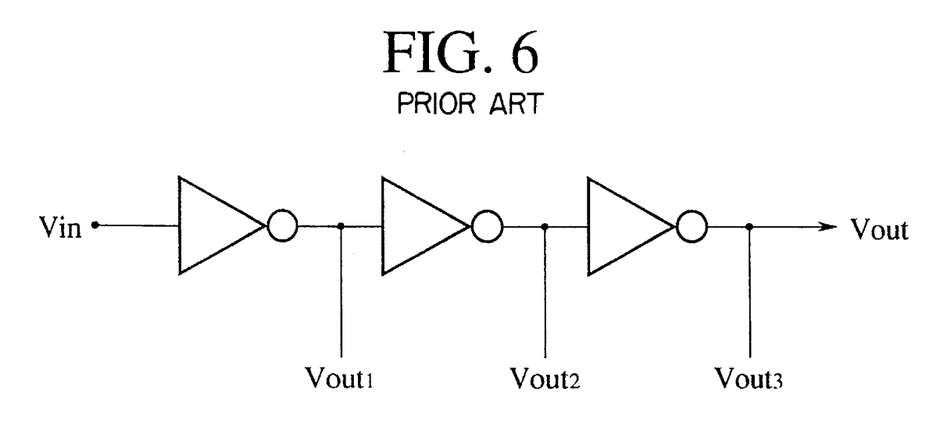
FIG. 6 is a configuration of a inverter gate chain consists of the BiCMOS inverter shown in FIG. 2 or FIG. 5.
Figure 7A:
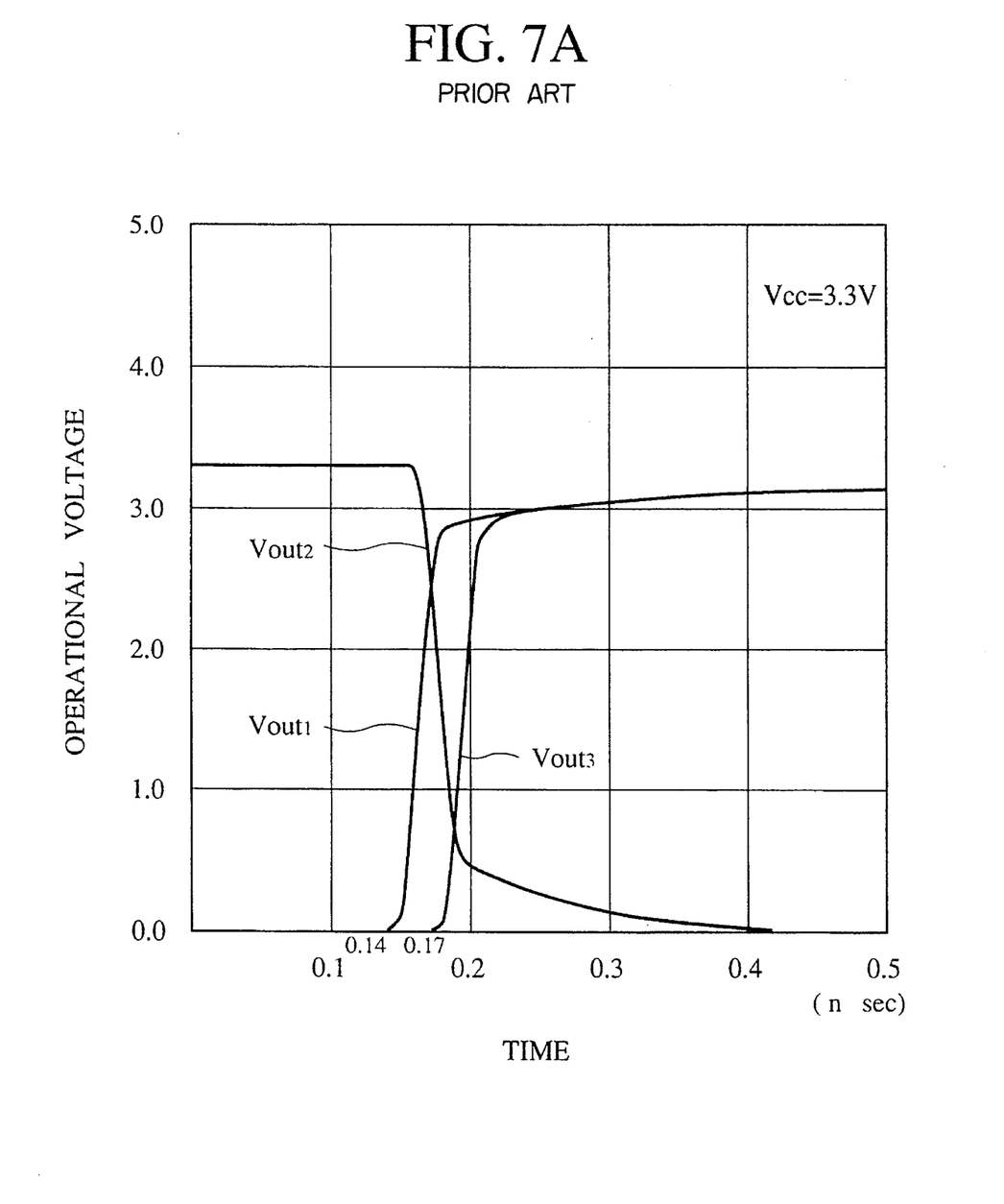
FIGS. 7A and 7B are diagrams showing the wave form of the output in the case where three of the conventional BiCMOS inverter shown in FIG. 5 is connected in series in a three-stage concatenation under VCC=3.3 Volts and VCC= 5.0 Volts, respectively.

FIG. 7A shows the waveforms of the outputs Vout1, Vout2, and Vout3 at the each stage of an inverter gate chain wherein the BiCMOS inverter shown in FIG. 4 or FIG. 5 are connected in series in a three-stage shown in FIG. 6. This gate is operated under a source voltage VCC=3.3 volts.

Figure 7B:
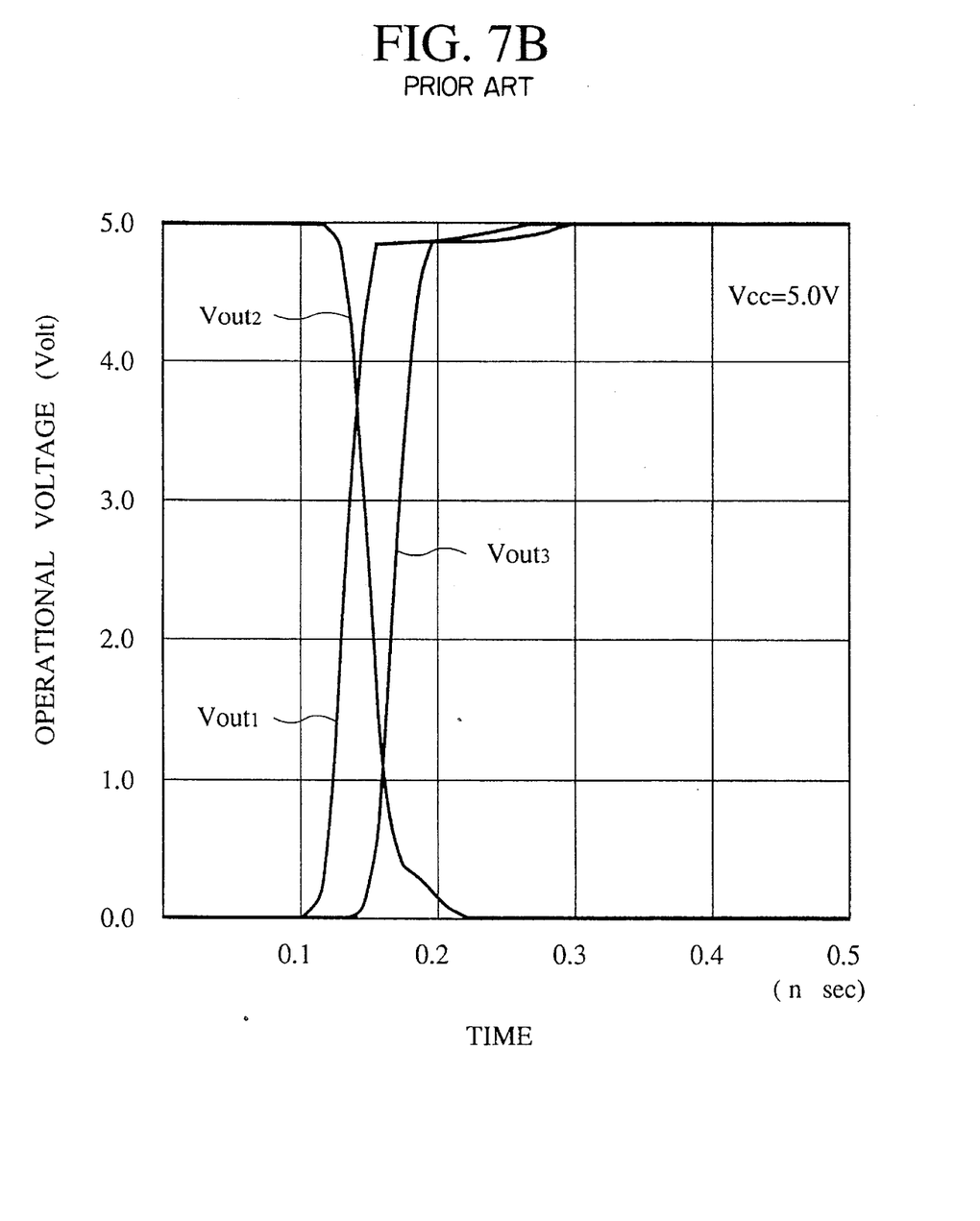

FIG. 7B shows the waveforms of the outputs Vout1, Vout2, and Vout3 at the each stage of the inverter gate chain. This gate is operated under a source voltage VCC=5.0 volts.

As can be clearly understood from FIG. 7A, the pull-up waveforms at the outputs Vout1 and Vout3, and the pull-down waveform at the output Vout2 abruptly rise or fall between the time 0.14 and the time 0.2 and then these waveforms Vout1, Vout2, and Vout 3 slowly undergo a full swing by a MOS transistor 104.

FIG. 8 is a circuit diagram showing another conventional BiNMOS gate. Like reference numerals designate pans identical or corresponding to those illustrated in FIG. 3.

This BiCMOS gate shown in FIG. 8 is a modification of the BiCMOS gate shown in FIG. 3, which performs a full swing operation at the section side of pull-up operation. Specifically, a P-MOS transistor 151 for supporting the pull-up operation added to the BiNMOS inverter of FIG. 3.

The pull-up operation can perform a full swing to the source voltage VCC from operation of the P-MOS 151.

FIG. 8 shows waveforms of the outputs Vout1, Vout2, and Vout3 at the various stages of the inverter gate chain shown which connects three of the BiCMOS inverter in series shown in FIG. 8. The gate is operated under a source voltage VCC=3.3 v.

Figure 9:
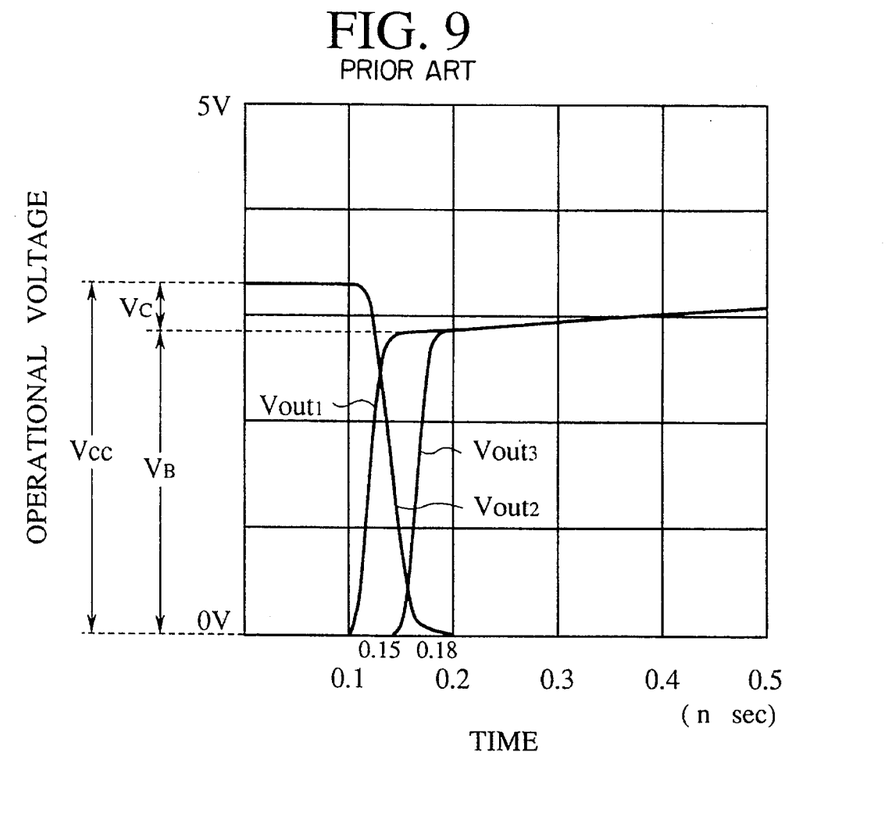
FIG. 9 is a diagram showing the wave form of the output in the case where three of the conventional BiNMOS inverter shown in FIG. 8 is connected in series in a three-stage concatenation.

As can be clearly understood from FIG. 9, the outputs Vout1 and Vout3 in the inverter gate chain, which are pull-up waveforms, abruptly rise (from the time 0.1 to the time 0.18) from a stable level (from the time 0 to the time 0.18) and then, these waveforms slowly undergo a full swing (after the time 0.18) by a PMOS transistor 151, and are charged to the source voltage VCC. Also, the output Vout2, which is a pull-down waveform, is driven by the N-MOS 124, so that a comparatively small deterioration is exhibited in FIG. 7.

However, the following problem areas exist in the BiCMOS gate and the BiNMOS gate explained with reference to FIG. 4 to FIG. 9.

For example, the voltage region indicated as VB in FIG. 9 represents high speed charging by the bipolar transistor, and the voltage region indicated as VC represents slow charging by the MOS transistor. When the source voltage VCC is comparatively high (3.3 v to 5.0 v), the portion accounted for by VC is small in comparison with the source voltage VCC, therefore the deterioration of the gate delay attributable to a change in potential in the range VC can be ignored.

However, the miniaturization of MOS transistors is continuing, and when this is accompanied by a further lowering of the source voltage VCC (3.3 v to 2.5 v) the value of VC does not correspondingly decrease. Accordingly, the portion accounted for by VC becomes relatively large in comparison with the source voltage VCC. As a result, there is the problem that the gate delay abruptly increases.

SUMMARY OF THE INVENTION

Accordingly, an object of the present invention is, with due consideration to the drawbacks of such conventional semiconductor logic circuits, to provide a semiconductor logic circuit wherein increase of gate delay accompanying a lowering of the source voltage can be reduced.

As a preferred embodiment of the present invention, a semiconductor logic circuit using a first power source and a second power source, comprises:

a first bipolar transistor whose collector being connected to the first power source and whose emitter being connected to an output node; and a first P-type field effect transistor group comprising at least one P-type field effect transistor through which a drain-source current channel consists of the base of the first bipolar transistor and the second power source based on an input signal transmitted to at lease one input node, wherein a potential of the second power source is higher than a potential of the first power source.

The semiconductor logic circuit described above, further comprises:

a second P-type field effect transistor connected to the first P-type field effect transistor group in series;

a first N-type field effect transistor through which a drain-source current channel being formed between the base of the first bipolar transistor and a fifth power source; and a second N-type field effect transistor group comprising at least one N-type field effect transistor through which a drain-source current channel being formed between the base of the first bipolar transistor and a third power source based on the input signal transmitted to at lease one input node, wherein a feed back signal fed from the output node is transmitted to the gate of the second P-type field effect transistor and the gate of the first N-type field effect transistor, and a voltage potential of the fifth power source is higher than or equal to a voltage potential of the third power source.

The semiconductor logic circuit described above, further comprises:

a second bipolar transistor whose emitter and collector connected to the third power source and the output node; and a third N-type field effect transistor group comprising at least one N-type field effect transistor through which a drain-source current channel consists of the base of the second bipolar transistor and a fourth power source based on the input signal transmitted to at least one input node, wherein a voltage potential of the fourth power source is lower than the voltage potential of the third power source.

The semiconductor logic circuit described above, further comprises:

a fourth N-type field effect transistor connected to the third N-type field effect transistor group in series;

a third P-type field effect transistor through which a drain-source current channel being formed between the base of the second bipolar transistor and a sixth power source; and a fourth P-type field effect transistor group comprising at least one P-type field effect transistor through which a drain-s source current channel being formed between the base of the second bipolar transistor and the first power source based on the input signal transmitted to at least one input node, wherein a feed back signal fed from the output node is transmitted to the gate of the fourth N-type field effect transistor, the gate of the third P-type field effect transistor, and the voltage potential of the sixth power source is equal to or lower than the voltage potential of the first power source.

In the semiconductor logic circuit described above, the number of the input node is two, the number of the first P-type field effect transistor, the second N-type field effect transistor, the first N-type field effect transistor, the P-type field effect transistor is two, respectively.

In the semiconductor logic circuit described above, the number of the input node is two, the number of the first P-type field effect transistor, the second P-type field effect transistor, the third P-type field effect transistor, the fourth P-type field effect transistor, the first N-type field effect transistor, the second N-type field effect transistor, the third N-type field effect transistor is tow, respectively.

BRIEF DESCRIPTION OF THE DRAWINGS

These and other objects, features, and advantages of the present invention will become more apparent from the following description of the preferred embodiments taken in conjunction with the accompanying drawings, in which.

DETAILED DESCRIPTION OF THE PREFERRED EMBODIMENTS

Other features of this invention will become apparent in the course of the following description of exemplary embodiments which are given for illustration of the invention and are not intended to be limiting thereof.

Embodiments of the present invention will now be explained with reference to the drawings.

Figure 10:
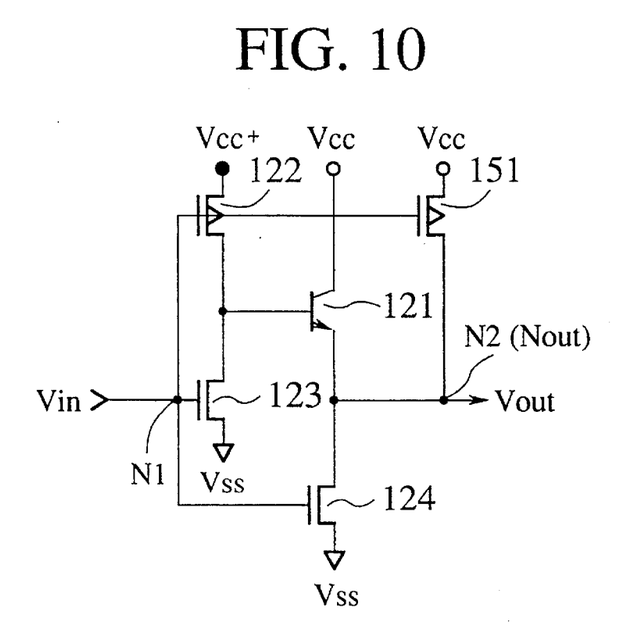
FIG. 10 is a circuit diagram showing a first embodiment of a semiconductor logic circuit (BiNMOS gate or inverter) of the present invention.

FIG. 10 is a circuit diagram showing a first embodiment of a semiconductor logic circuit of the present invention.

Like reference numerals designate parts identical to or corresponding to the reference numerals used in FIG. 8.

In this semiconductor logic circuit, in the conventional BiNMOS gate shown in FIG. 8, for the collector side of a source voltage (first source) VCC of a first bipolar transistor 121 and the source side of the source voltage VCC of a P-MOS transistor 151 (P-type field-effect transistor) used as a pull-up support, the source potential of a first P-MOS transistor 122 (first P-type field-effect transistor) for charging the base of the first bipolar transistor 121 is taken as VCC+ (second source), and this source potential VCC+ is set so that the relationship VCC+>VCC is produced.

By means of this BiNMOS inverter, when an input signal VIN entered into an input node N1 is at the L level, the first P-MOS transistor 122 is ON and the first N-MOS transistor 124 is OFF. Therefore, the base of the first bipolar transistor 121 is charged up to the potential VCC+ and the first bipolar transistor 121 is ON. At this time, because the first N-MOS transistor 124 is OFF, an output node N2 (Nout) is rapidly charged to Vout=VCC+–VBE by the operation of the first bipolar transistor 121 and an H level output Vout is obtained.

When the input signal VIN is switched from the H level to the L level, the first P-MOS transistor 122 is OFF and a N-MOS transistor 123 (N-type field-effect transistor) used for pulling out electric charges at a base side is ON. As a result, the first bipolar transistor 121 is OFF, and simultaneously the first N-MOS transistor 124 is ON. In this manner, an L-level output Vout is obtained at the node N2 (Nout).

By means of this embodiment, even if the lowering of the source voltage VCC continues, the output node N1 is rapidly charged to the potential Vout=VCC+−VBE by the operation of the first bipolar transistor 121 so that the pull-up waveform rises steeply to a higher voltage than the pull-up waveform of the conventional BiNMOS gate (shown in FIG. 9). As a result, the deterioration of the gate velocity which accompanies the reduction of the source voltage VCC can be avoided.

Figure 11:
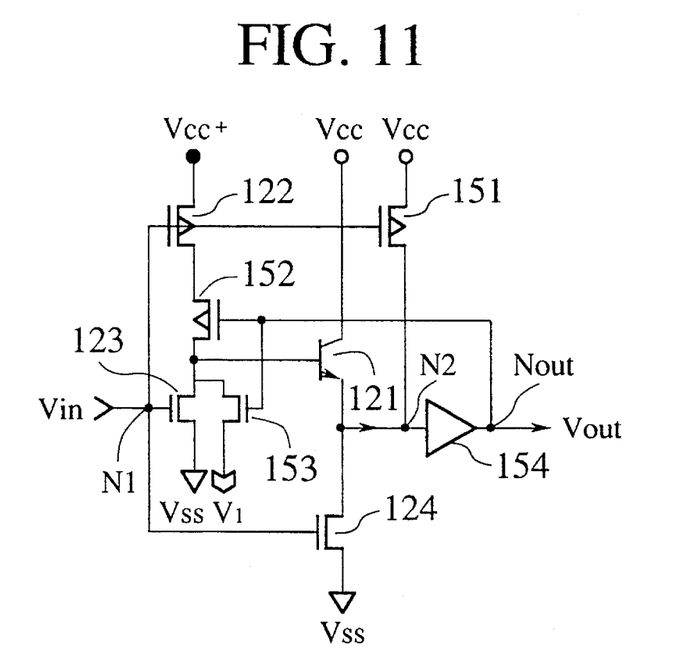
FIG. 11 is a circuit diagram showing a second embodiment of a semiconductor logic circuit (BiNMOS gate or inverter) of the present invention.

FIG. 11 is a circuit diagram showing a second embodiment of a semiconductor logic circuit of the present invention. Like reference numerals designate parts identical to or corresponding to those illustrated in FIG. 10.

In the BiNMOS inverter of the first embodiment shown in FIG. 10, when the input signal VIN at the L level is applied to the input node N1 as outlined above, the base of the bipolar transistor 121 is charged to the voltage VCC+. However, at this time, because the source voltage VCC is applied to the collector of the bipolar transistor 121, the bipolar transistor 121 is in a saturated state. When the bipolar transistor 121 is saturated, a current flows through a substrate of the BiNMOS inverter and the operation of the bipolar transistor 121 worsens. This condition affects the input signal VIN of L level in the BiNMOS gate of the first embodiment shown in FIG. 10 which is undesirable. This is a problem.

Accordingly, in order to overcome the problem of this first embodiment of the BiNMOS gate, a P-MOS transistor (second P-type field-effect transistor) 152 is connected between the drain of the first P-MOS transistor 122 and the base of the first bipolar transistor 121 in the BiNMOS gate shown in FIG. 10. Also, an N-MOS transistor (second N-type field-effect transistor) 153 is connected between the base of the first bipolar transistor 121 and a lower-order potential (fifth power source) V1. A feed-back signal from a feed-back delay 154 connected to the output node Nout is supplied to the gates of the second P-MOS transistor 152 and the second N-MOS transistor 153. The lower-order potential V1 is higher than the potential VSS.

When the output signal VIN is switched from the H level to the L level in the BiNMOS gate of this embodiment, first, the first P-MOS transistor 122 comes ON. Because the L level is still applied to the gate of the second P-MOS transistor 152 directly after the switch from the H level to the L level, the second P-MOS transistor 152 is in the ON state. Accordingly, as a result of the base of the bipolar transistor 121 being charged to the potential VCC+, the output Vout reaches the H level, and after a fixed time has elapsed for the feed-back delay 154, the H level is applied to the gates of the second P-MOS transistor 152 and the second N-MOS transistor 153. As a result, the second P-MOS transistor 152 goes OFF and the second N-MOS transistor 153 comes ON, so that the base of the first bipolar transistor 121 is discharged to the ground level.

In this manner, for the BiNMOS inverter of this embodiment, the time period in which the first bipolar transistor 121 reaches a saturated state can be restricted to only a fixed time directly after the input signal VIN is changed. This is an important feature of the second embodiment of the present invention.

In addition, in the second embodiment, in the same manner as in the first embodiment shown in FIG. 10, when the input signal VIN is at the L level, the base of the first bipolar transistor 121 is charged to the voltage potential VCC+, the output node N2 (Nout) is rapidly charged to Vout=VCC+−VBE by the operation of the first bipolar transistor 121, and the pull-up waveform of the pull-up operation abruptly rises to a higher voltage. Therefore, the deterioration of the gate delay which accompanies the reduction of the source voltage VCC can be avoided.

These advantages of the BiNMOS inverter as the second embodiment shown in FIG. 11 will now be explained in detail in comparison with the conventional BiNMOS inverter illustrated in FIG. 8.

Figure 12:
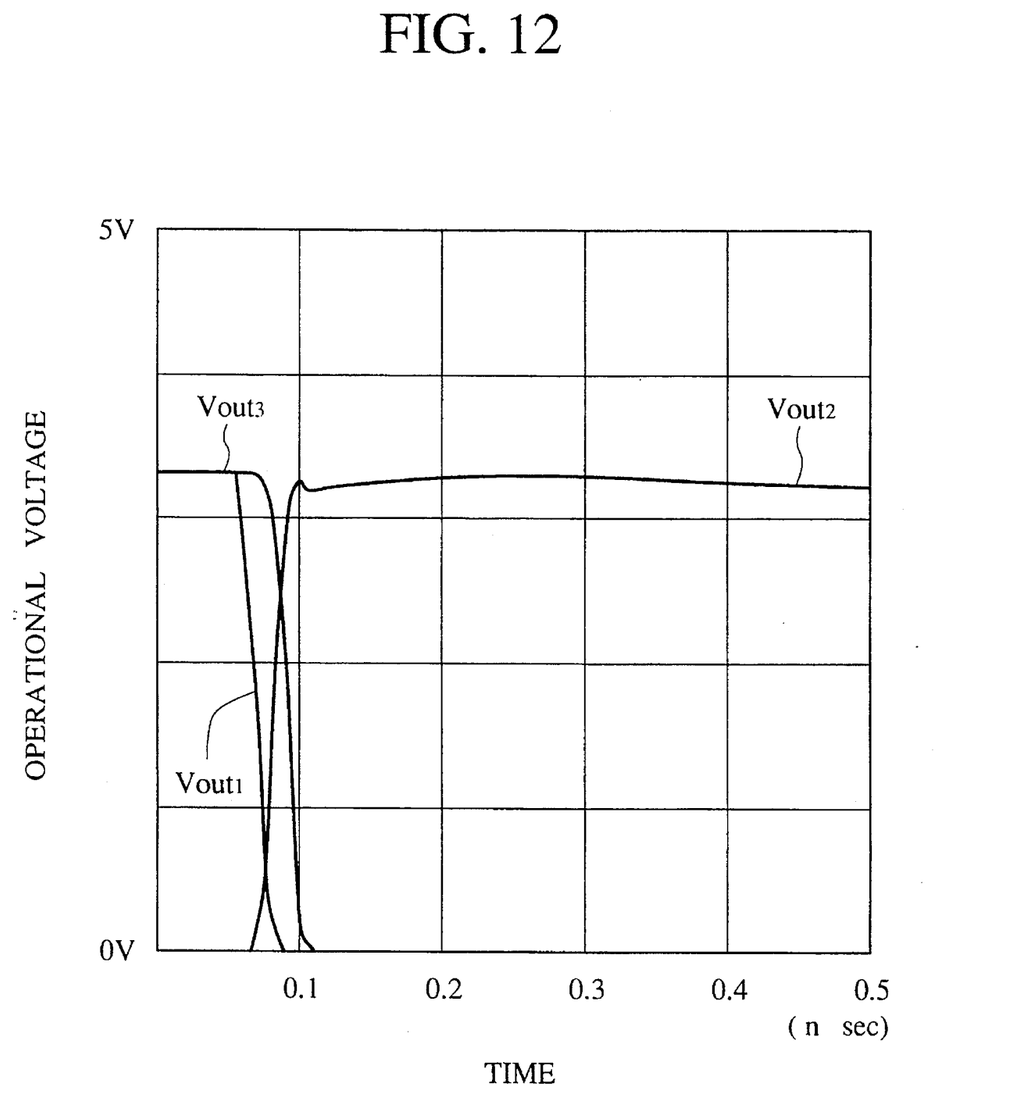
FIG. 12 is a diagram showing the wave form at each stage of the output in the case where a BiNMOS inverter of the second embodiment shown in FIG. 11 is connected in a three-stage concatenation.

FIG. 12 is a diagram showing the waveforms for the outputs Vout1, Vout2, Vout3 at each stage of the inverter gate chain comprising three of the BiNMOS inverter connected in series as the second embodiment. The operating conditions for the inverter gate are the source voltage VCC=3.3 Volts, and the potential VCC+=3.8 Volts.

In the output waveforms shown in FIG. 9 of the BiNMOS inverter shown in FIG. 8, because the change of the pull-up waveform (output Vout1) becomes slowly at the 2.7 Volts of the operation voltage. This indicates that the node Nout is slowly charged by the P-MOS transistor 151 at the voltage 2.7 Volts, this slow change causes deterioration in the pull-down waveform of the next stage (output Vout2) in the inverter gate chain comprising three of the BiNMOS inverter. Because of this, the gate velocity deteriorates strikingly as the voltage is lowered.

With the output waveform of the inverter gate chain comprising three of the BiNMOS inverter as the second embodiment shown in FIG. 12, the pull-up waveform (output Vout2) rises rapidly to a voltage higher than conventionally obtained. Accordingly, the deterioration of the pull-down waveform (output Vout3) of the next stage is reduced. As a result, the deterioration of the gate velocity which accompanies the reduction of the source voltage VCC can be avoided.

Figure 13:
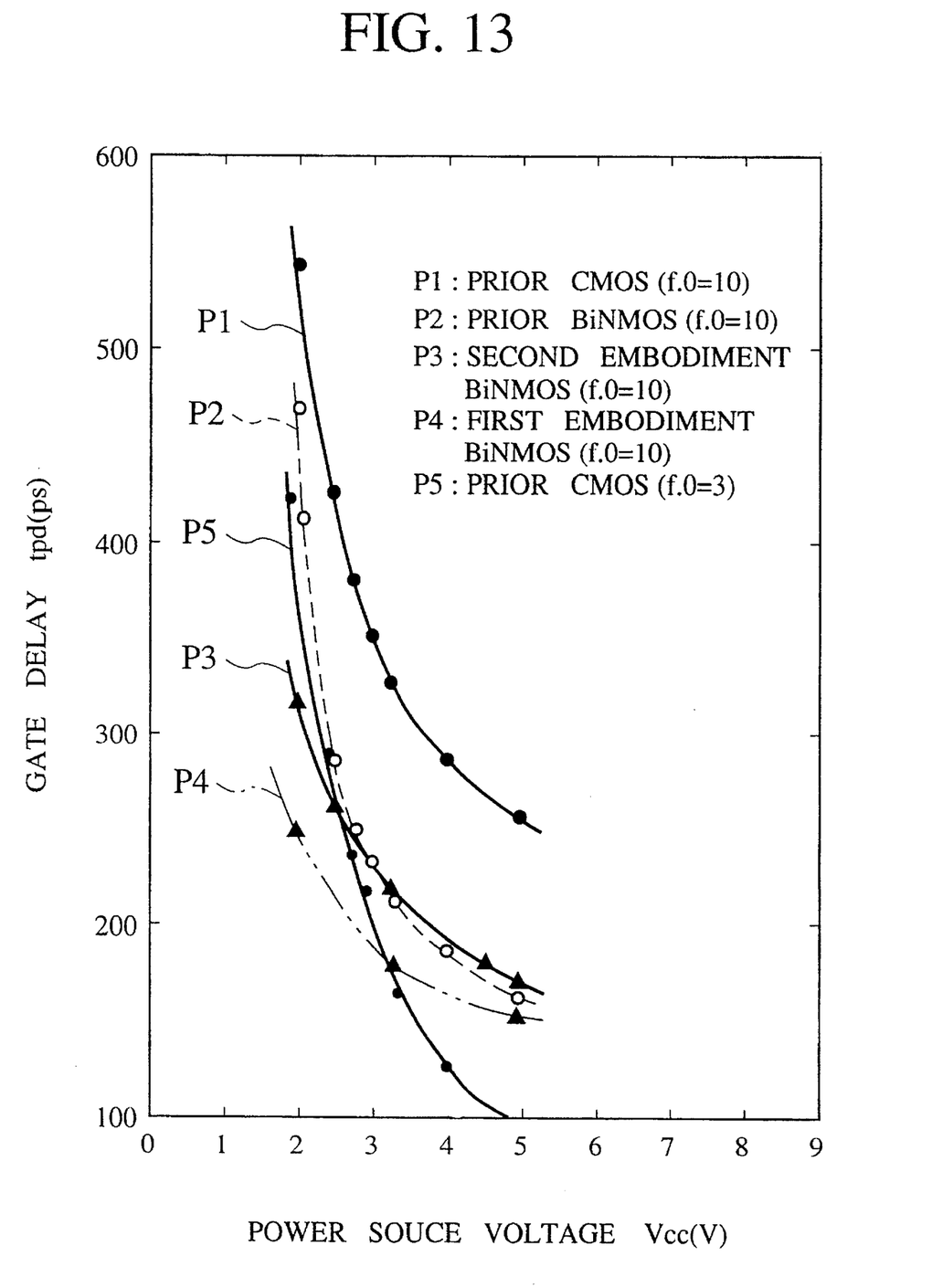
FIG. 13 is a diagram showing a gate delay (tpd) with respect to a power source voltage VCC.

FIG. 13 is a diagram showing the relationship of a gate delay tpd with respect to the source voltage VCC in the BiNMOS gates of the first and second embodiments shown in FIGS. 10 and 11, respectively, the conventional BiNMOS gate (FIG. 8), and the conventional CMOS gate (FIG. 2).

In the FIG. 13, P1 shows the trend of the gate delay of a conventional CMOS gate (where f.0=(output capacity)/(input capacity)=10), P2 shows the trend of the gate delay of a conventional BiNMOS gate (where f.0=10), P3 shows the trend of the gate delay of the BiNMOS gate of the second embodiment (where f.0=10), P4 shows the trend of the gate delay of the BiNMOS gate of the first embodiment (where f.0=10), and P5 shows the trend of the gate delay of a conventional CMOS gate (where f.0=3).

As this FIG. 13 clearly shows, the conventional BiNMOS gate (P2) shows a source voltage dependence of the same degree as the CMOS gate when the source voltage VCC is 3 Volts or greater, and gate delay for the CMOS gate is seen to suddenly deteriorate when the source voltage VCC is about 3 volts or less.

As opposed to this, in the BiNMOS gate of the present invention a sudden deterioration of the gate delay is not seen (see P3, and P4 shown in FIG. 13), even when the source voltage VCC is 3 v or less.

Figure 14:
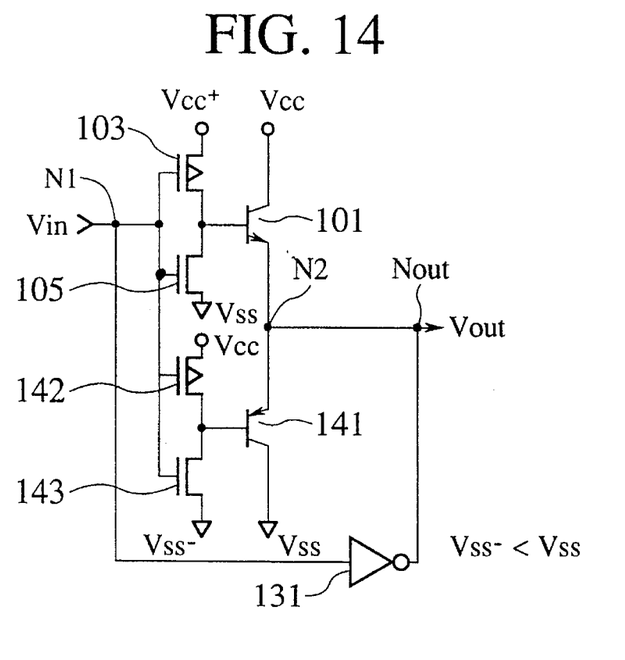
FIG. 14 is a circuit diagram showing a third embodiment of a semiconductor logic circuit (BiCMOS gate or inverter) of the present invention.

FIG. 14 is a circuit diagram showing a third embodiment of a semiconductor logic circuit of the present invention. Like reference numerals designate parts identical to or corresponding to those illustrated in FIG. 5.

The BiCMOS inverter of the third embodiment shown in FIG. 14 is an example of the application of the present invention to the conventional BiCMOS inverter shown in FIG. 5. Specifically, the source potential of a P-MOS transistor 103 for charging the base of a bipolar transistor 101 used for driving a pull-up operation in the pull-up section is VCC+. The source potential VCC+ is set so that the relationship VCC+>VCC is produced. Also, the source potential of an N-MOS transistor (third N-type field-effect transistor) 143 for discharging the base of a bipolar transistor (second bipolar transistor) 141 used for driving the pull-down operation in the pull-down section is VSS− (fourth power source). The source potential VSS+ is set so that the relationship VSS−>VSS is produced.

In this type of configuration shown in FIG. 14, the deterioration of the gate delay which accompanies the reduction of the source voltage VCC can be avoided.

Figure 15:
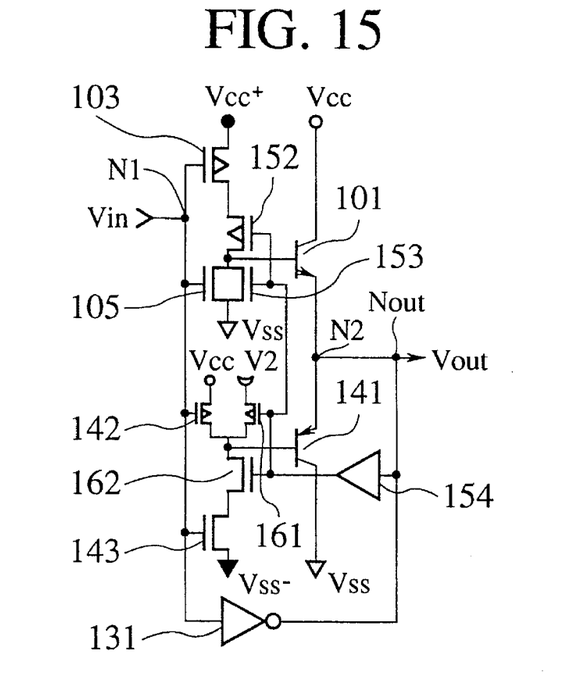
FIG. 15 is a circuit diagram showing a fourth embodiment of a semiconductor logic circuit (BiCMOS gate or inverter) of the present invention.

FIG. 15 is a circuit diagram showing a fourth embodiment of a semiconductor logic circuit of the present invention. Like reference numerals designate parts identical to or corresponding to those illustrated in FIG. 11 (second embodiment) and FIG. 14 (third embodiment).

The BiCMOS inverter of the fourth embodiment shown in FIG. 15 is an example of an application of the present invention to the conventional BiCMOS inverter shown in FIG. 5. Specifically, the concept of the second embodiment shown in FIG. 11, wherein the time period for the bipolar transistor to reach a saturated condition is limited, is applied into the BiCMOS inverter of the third embodiment shown in FIG. 14.

As shown in FIG. 14, in addition to the configuration of the pull-up section in the BiCMOS inverter shown in FIG. 14, a P-MOS transistor 152 and a N-MOS transistor 153 with the same function as the gate shown in FIG. 11 are added, and, in addition to the configuration of the pull-down section shown in FIG. 14, a P-MOS transistor (third P-type field-effect transistor) 161 connected in parallel with the P-MOS transistor (fourth P-type field-effect transistor) 142, and an N-MOS transistor (fourth N-type field-effect transistor) 162 connected between the P-MOS transistors 142, 161 and the N-MOS transistor 143 are added. Then, a potential V2 lower than VCC is supplied to the source of the P-MOS transistor 161. In addition, a feed-back signal from the feed-back delay 154 connected to the output node is supplied to the gates of the P-MOS transistor 152, the N-MOS transistor 153, the P-MOS transistor 161, and the N-MOS transistor 162.

In this type of configuration shown in FIG. 15, the deterioration of the gate delay which accompanies the reduction of the source voltage VCC can be avoided. In addition, the time for the bipolar transistors 101, 141 to reach a saturated condition can be restricted merely to a fixed time directly after the input signal VIN is converted.

Figure 16:
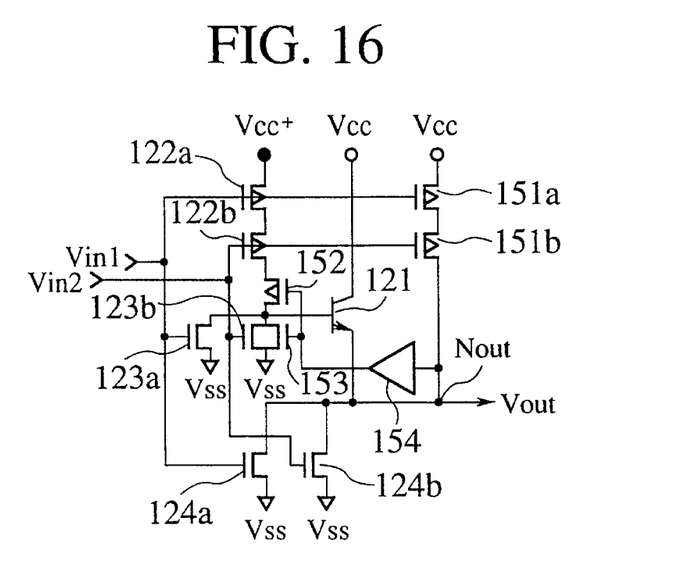
FIG. 16 is a circuit diagram showing a fifth embodiment of a semiconductor logic circuit (BiNMOS inverter) of the present invention.

FIG. 16 is a circuit diagram showing a fifth embodiment of a semiconductor logic circuit of the present invention. Like reference numerals designate parts identical to or corresponding to those illustrated in FIG. 11.

In this embodiment, an example is shown where two input NOR gates correspond to the BiCMOS inverter of the second embodiment (FIG. 11).

The two input NOR gates shown in FIG. 16 are provided with a pair of P-MOS transistors 122a and 122b equivalent to the P-MOS transistor 122 shown in FIG. 11, a pair of N-MOS transistors 123 and 123b equivalent to the N-MOS transistor 123, a pair of N-MOS transistor 124a and 124b equivalent to the N-MOS transistor 124, and a pair of P-MOS transistor 151a and 151b equivalent to the P-MOS transistor 151 respectively, corresponding to the two input signals VIN1, VIN2.

Even in the case of a BiNMOS gate consists of two input NOR gates of this type, an operation effect the same as in the second embodiment shown in FIG. 11 is of course obtained.

Figure 17:
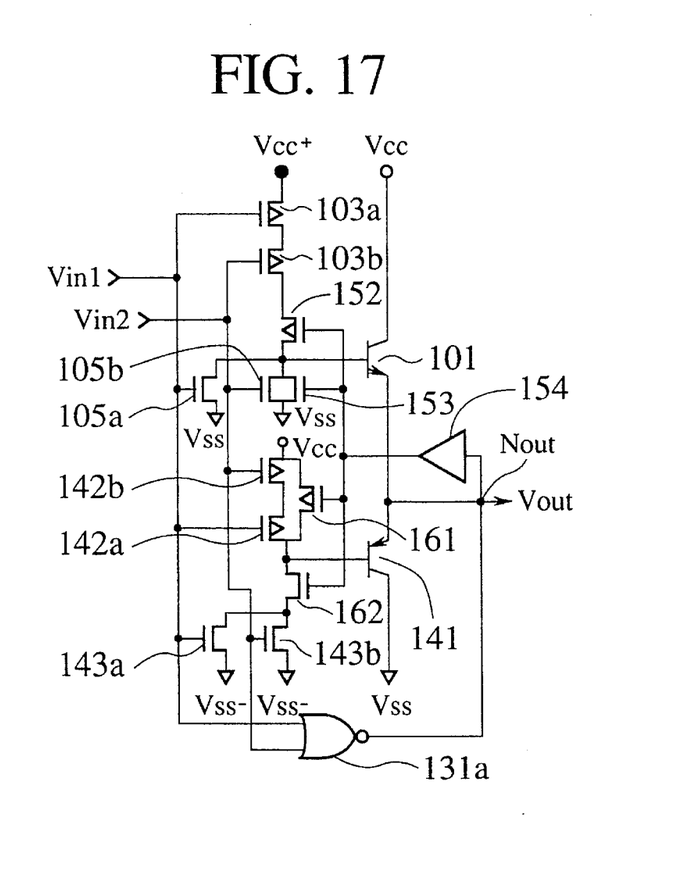
FIG. 17 is a circuit diagram showing a sixth embodiment of a semiconductor logic circuit (BiCMOS inverter) of the present invention.

FIG. 17 is a circuit diagram showing a sixth embodiment of a semiconductor logic circuit of the present invention.

Like reference numerals designate parts identical to or corresponding to those illustrated in shown FIG. 15.

In this embodiment an example is shown where two input NOR gates are equivalent to the BiCMOS inverter of the fourth embodiment (FIG. 15).

The two input NOR gates are provided with a pair of P-MOS transistors 103a and 103b equivalent to the P-MOS transistor 103 shown in FIG. 15, a pair of N-MOS transistors 105a and 105b equivalent to the N-MOS transistor 105, a pair of P-MOS transistors 142a and 142b equivalent to the P-MOS transistor 142, and a pair of N-MOS transistors 143a and 143b equivalent to the N-MOS transistor 143 respectively, corresponding to the two input signals VIV1, VIN2. In addition, two input NOR gate 131a is formed, equivalent to the inverter 131 shown in FIG. 15.

Even in the case of a BiNMOS gate consists of two input NOR gate of this type shown in FIG. 17, an operation effect the same as in the fourth embodiment is of course obtained.

As explained in detail in the foregoing, in the present invention, a potential of the second power source which is higher than that of the first power source is supplied to the source potential of the first P-type field-effect transistor group. In addition, as a prerequisite to this, because a potential of the fourth power source lower than that of the third power source is supplied to the source potential of the third P-type field-effect transistor group, the deterioration of the gate velocity which accompanies the reduction of the source voltage can be reduced.

In addition, by applying a signal fed back from an output node across a gate of the second P-type field-effect transistor and a gate of the first N-type field-effect transistor, or across a gate of the fourth N-type field-effect transistor and a gate of the third P-type field-effect transistor, a time period in which a first or a second bipolar transistor reaches a saturated state can be restricted to a fixed time directly after the input signal is changed, and it is possible to maintain good operation in the first or the second bipolar transistor while reducing the deterioration in the gate delay.

It will be apparent that any modifications and variations may be implemented without departing from the scope of the novel concept of this invention. Therefore it is intended by the appended claims to cover all such modifications and variations which fall within the true spirit and scope of the invention.

What is claimed is:

1. A semiconductor logic circuit using a first power source and a second power source, comprising:

a first bipolar transistor having a collector being connected to the first power source and an emitter being connected to an output node, the first bipolar transistor further having a base;

a first P-type field effect transistor through which a drain-source current channel is formed between the base of the first bipolar transistor and the second power source based on an input signal transmitted to at least one input node; and a second P-type field effect transistor through which a drain-source current channel is formed between the output node and the first power source, wherein a potential of the second power source is greater than a potential of the first power source.

2. A semiconductor logic circuit using a first power source and a second power source, comprising:

a first bipolar transistor having a collector being connected to the first power source and an emitter being connected to an output node, the first bipolar transistor further having a base;

a first P-type field effect transistor group comprising at least one P-type field effect transistor through which a drain-source current channel is formed between the base of the first bipolar transistor and the second power source based on an input signal transmitted to at least one input node, wherein a potential of the second power source is greater than a potential of the first power source.

a second P-type field effect transistor connected in series to the first P-type field effect transistor group, the second p-type field effect transistor having a gate;

a first N-type field effect transistor through which a drain-source current channel is formed between the base of the first bipolar transistor and a third power source, the first N-type field effect transistor having a gate; and a second N-type field effect transistor group comprising at least one N-type field effect transistor through which a drain-source current channel is formed between the base of the first bipolar transistor and a fourth power source based on the input signal transmitted to the at least one input node, wherein a feedback signal fed from the output node is transmitted to the gate of the second P-type field effect transistor and the gate of the first N-type field effect transistor, and a voltage potential of the third power source is greater than or equal to a voltage potential of the fourth power source.

3. A semiconductor logic circuit using a first power source and a second power source, comprising:

a first bipolar transistor having a collector being connected to the first power source and an emitter being connected to an output node, the first bipolar transistor further having a base;

a first P-type field effect transistor group comprising at least one P-type field effect transistor through which a drain-source current channel is formed between the base of the first bipolar transistor and the second power source based on an input signal transmitted to at least one input node, wherein a potential of the second power source is greater than a potential of the first power source;

a second P-type field effect transistor connected in series to the first P-type field effect transistor group, the second P-type field effect transistor having a gate;

a first N-type field effect transistor through which a drain-source current channel is formed between the base of the first bipolar transistor and a third power source, the first N-type field effect transistor having a gate;

a second N-type field effect transistor group comprising at least one N-type field effect transistor through which a drain-source current channel is formed between the base of the first bipolar transistor and a fourth power source based on the input signal transmitted to the at least one input node, wherein a feedback signal fed from the output node is transmitted to the gate of the second P-type field effect transistor and the gate of the first N-type field effect transistor, and a voltage potential of the third power source is greater than or equal to a voltage potential of the fourth power source;

a second bipolar transistor having an emitter and collector respectively connected to the fourth power source and the output node, the second bipolar transistor further having a base; and a third N-type field effect transistor group comprising at least one N-type field effect transistor through which a drain-source current channel is formed between the base of the second bipolar transistor and a fifth power source based on the input signal transmitted to the at least one input node, wherein a voltage potential of the fifth power source is lower than the voltage potential of the fourth power source.

4. A semiconductor logic circuit as claimed in claim 2, further comprising:

a second bipolar transistor having an emitter and collector respectively connected to the third power source and the output node, the second bipolar transistor further having a base; and a third N-type field effect transistor group comprising at least one N-type field effect transistor through which a drain-source current channel is formed between the base of the second bipolar transistor and a fifth power source based on the input signal transmitted to the at least one input node, wherein a voltage potential of the fifth power source is lower than the voltage potential of the fourth power source.

5. A semiconductor logic circuit as claimed in claim 3, further comprising:

a fourth N-type field effect transistor connected in series to the third N-type field effect transistor group, the fourth N-type field effect transistor having a gate;

a third P-type field effect transistor through which a drain-source current channel is formed between the base of the second bipolar transistor and a sixth power source, the third P-type field effect transistor having a gate; and a fourth P-type field effect transistor group comprising at least one P-type field effect transistor through which a drain-source current channel is formed between the base of the second bipolar transistor and the first power source based on the input signal transmitted to the at least one input node, wherein a feedback signal fed from the output node is transmitted to the gate of the fourth N-type field effect transistor and the gate of the third P-type field effect transistor, and wherein the voltage potential of the sixth power source is equal to or lower than the voltage potential of the first power source.

6. A semiconductor logic circuit as claimed in claim 4, further comprising:

a fourth N-type field effect transistor connected in series to the third N-type field effect transistor, the fourth N-type field effect transistor having a gate;

a third P-type field effect transistor through which a drain-source current channel is formed between the base of the second bipolar transistor and a sixth power source; and a fourth P-type field effect transistor group comprising at least one P-type field effect transistor through which a drain-source current channel is formed between the base of the second bipolar transistor and the first power source based on the input signal transmitted to the at least one input node, wherein a feedback signal fed from the output node is transmitted to the gate of the fourth N-type field effect transistor and the gate of the third P-type field effect transistor, and wherein the voltage potential of the sixth power source is equal to or lower than the voltage potential of the first power source.

7. A semiconductor logic circuit as claimed in claim 2, wherein a number of nodes of the at least one input node is two, a number of transistors in the first P-type field effect transistor group is two, and a number of transistors in the second N-type field effect transistor group.

8. A semiconductor logic circuit as claimed in claim 5, wherein a number of nodes of the at least one input node is two, a number of transistors in the first P-type field effect transistor group, the fourth P-type field effect transistor group, the second N-type field effect transistor group, and the third N-type field effect transistor group is two, respectively.

\* \* \* \* \*